(12) United States Patent
Oda

(10) Patent No.: US 6,211,062 B1
(45) Date of Patent: Apr. 3, 2001

(54) METHOD FOR MANUFACTURING SEMICONDUCTOR DEVICE HAVING MULTIPLE WIRING LAYER

(75) Inventor: Noriaki Oda, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/175,342

(22) Filed: Oct. 20, 1998

(30) Foreign Application Priority Data

Oct. 23, 1997 (JP) .................................................. 9-290589

(51) Int. Cl.⁷ ............................................... H01L 21/4763
(52) U.S. Cl. ............................................... 438/623; 438/624
(58) Field of Search ................................... 438/623, 624, 438/780, 781, 783, 782, 659, 660

(56) References Cited

U.S. PATENT DOCUMENTS 5,866,945 * 2/1999 Chen et al. ........................... 257/750

OTHER PUBLICATIONS

Zoes, et al., "Planarization Performance of Flowable Oxide in the Sub–0.5 μm Regime", Conference Proceedings ULSI XI 1996 Materials Research Society, pp. 121–125 (1996).

* cited by examiner

Primary Examiner—Caridad Everhart
(74) Attorney, Agent, or Firm—McGinn & Gibb, PLLC

(57) ABSTRACT

A semiconductor device manufacturing method capable of manufacturing a semiconductor device having a small wiring capacitance even for a small wiring pitch is provided.

Steps of forming an interlayer insulating film containing a hydrogen silsesquioxance (HSQ) film on a wiring layer, implanting hydrogen ions into the HSQ film, and annealing the semiconductor device are included.

6 Claims, 8 Drawing Sheets

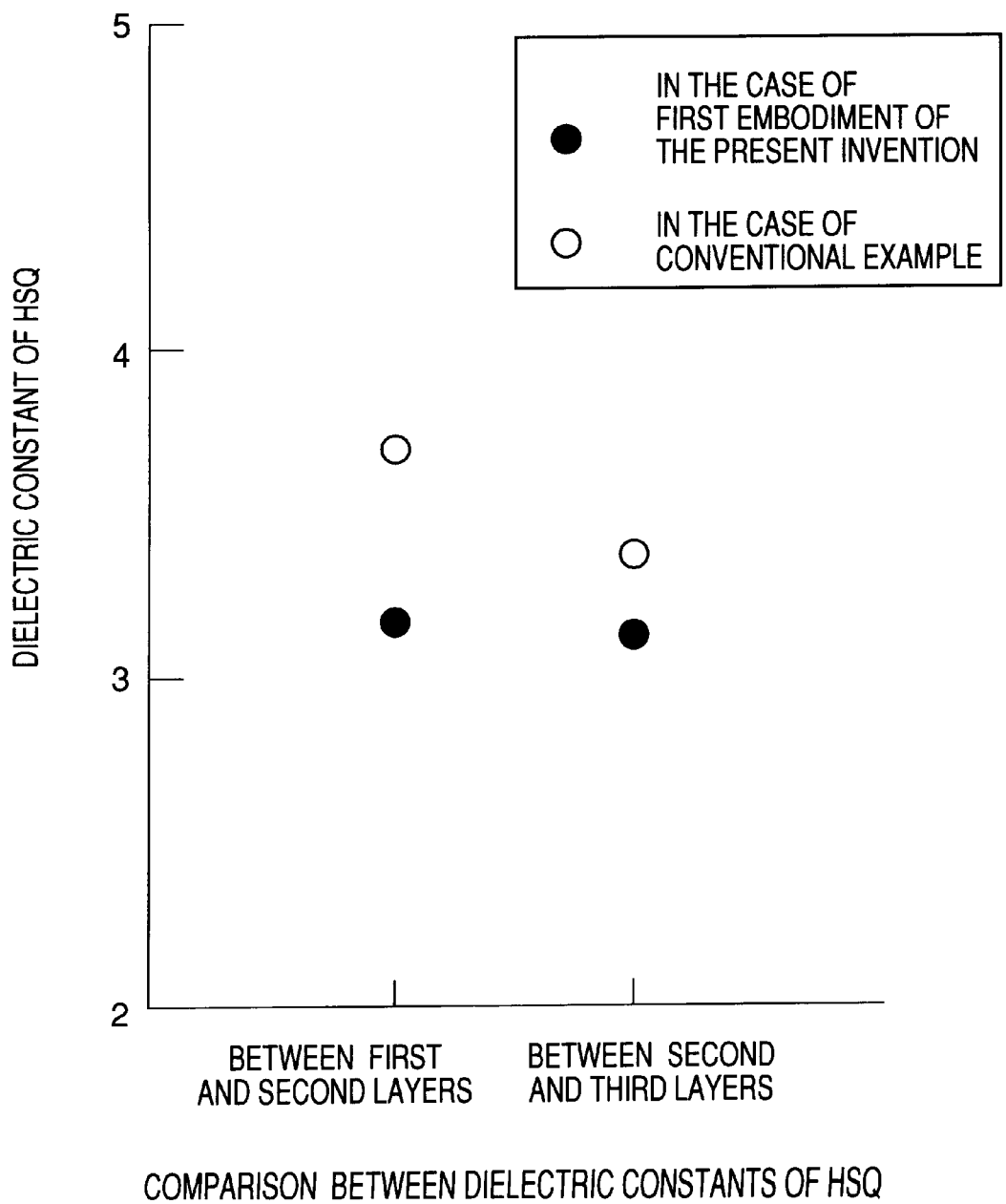

METHOD FOR MANUFACTURING SEMICONDUCTOR DEVICE HAVING MULTIPLE WIRING LAYER

BACKGROUND OF THE INVENTION

1. Field of the Invention

The present invention relates to a semiconductor device manufacturing method, particularly to a method for manufacturing a semiconductor device having a multiple wiring layer and using hydrogen silsesquioxane (hereafter referred to as HSQ) as a interlayer insulating film.

2. Description of the Related Art

In accordance with miniaturization of recent years, the wiring pitch of semiconductor devices having a multiple wiring layer has been decreased. When a wiring pitch decreases, the distance between adjacent wirings decreases and the capacitance between adjacent wirings referred to as wiring capacitance increases. Thereby, operating speed is lowered and power consumption is increased. It is proposed for these problems to use a film having a low dielectric constant (low dielectric constant film) as an interlayer insulating film instead of a silicon oxide film having been used so far. By using the low dielectric constant film, it is possible to realize a small wiring capacitance even for a semiconductor device having a small wiring pitch.

Low dielectric constant films made of various materials are already researched and developed. Particularly, HSQ is one of the most-prospective low dielectric constant films because it has heat resistance for a temperature of 1,400° C. or higher.

A conventional semiconductor device manufacturing method using HSQ as a interlayer insulating film is described in, for example, T. Zoes, B. Ahlburn, K. Erz, and M. Marsden, "Planarization Performance of Flowable Oxide in the Sub 0.5 $\mu$m Regime," Conference Proceedings ULSI XI 1996 Materials Research Society pp. 121–125 (1996).

A conventional semiconductor device manufacturing method same as the method described in the above document is described below by referring to FIGS. 7A and 7B and FIGS. 8A and 8B.

In FIG. 7A, on a first interlayer insulating film 1 made of BPSG (Boro-Phospho-Silicate Glass) film having a thickness of approx. 0.8 $\mu$m, a first refractory metal film 2 made of a titanium film having a thickness of approx. 30 nm and a titanium nitride film having a thickness of approx. 100 nm, a first metal film 3 made of an AlCu film having a thickness of approx. 0.5 $\mu$m, and a first antireflection film 4 made of a titanium nitride film having a thickness of approx. 50 nm for preventing reflection in a photolithographic process are formed from the bottom in this order through the sputtering method. Then, patterning is performed through a photolithographic process and reactive-ion etching to form a first wiring layer made of the first refractory metal film 2, first metal film 3, and first antireflection film 4. Thereafter, a first plasma oxide film 5 having a thickness of approx. 50 nm is formed through the plasma CVD method using, for example, a mixed gas of SiH$_4$ and NH$_3$. Further, HSQ is applied onto the first wiring layer so that the film thickness of HSQ reaches approx. 0.4 $\mu$m and then, baking is performed to form an HSQ film 6 as a interlayer insulating film. Furthermore, a second plasma oxide film 7 having a thickness of approx. 1.4 $\mu$m is formed on the HSQ film 6 using the plasma CVD method. At least either of chemical polishing and mechanical polishing is performed so that the sum of the thicknesses of the HSQ film 6 and the second plasma oxide film 7 reaches approx. 0.8 $\mu$m on the first wiring layer.

Then, as shown in FIG. 7B, a first via hole 8 is formed through a photolithographic process and reactive-ion etching. Then, a second refractory metal film 9 made up of a titanium film having a thickness of approx. 30 nm and a titanium nitride film having a thickness of approx. 100 nm is formed in the first via hole 8 and on the second plasma oxide film 7 through the sputtering method. Moreover, tungsten is deposited to approx. 0.5 $\mu$m through the CVD method using WF$_6$ or the like as a source gas and thereafter, a first tungsten film 10 is left only in the via hole 8 by etching-back. Then, a second metal film 11 made of an AlCu film having a thickness of approx. 0.5 $\mu$m and a second antireflection film 12 made of a titanium nitride film having a thickness of approx. 50 nm are formed on the entire surface by the sputtering method. Furthermore, patterning is performed through a photolithographic process and reactive-ion etching to form a second wiring layer made of the second refractory metal film 9, the second metal film 11 and the second antireflection film 12.

Then, as shown in FIG. 8A, a third plasma oxide film 14 having a thickness of approx. 50 nm is formed through the plasma CVD method using, for example, a mixed gas of SiH$_4$ and Mn. Thereafter, an HSQ film 15 having a thickness of approx. 1.4 $\mu$m is formed by applying HSQ onto the second wiring layer and baking it. Moreover, a fourth plasma oxide film 16 having a thickness of approx. 1.4 $\mu$m is formed on the HSQ film 15 through the plasma CVD method. Then, at least either of chemical polishing and mechanical polishing is performed so that the sum of the thicknesses of the HSQ film 15 and fourth plasma oxide film 16 reaches approx. 0.8 $\mu$m on the second wiring layer. Then, a second via hole 17 is formed through a photolithographic process and reactive-ion etching. Then, a third refractory metal film 18 made of a titanium film having a thickness of approx. 30 nm and a titanium nitride film having a thickness of approx. 100 nm is formed in the second via hole 17 through the sputtering method. Moreover, tungsten is deposited to approx. 0.5 $\mu$m through the CVD method using WF6 or the like as a source gas and thereafter, the tungsten is left only in the via hole 17 by etching-back to form a second tungsten film 100. Then, a third metal film 19 made of an AlCu film having a thickness of approx. 0.5 $\mu$m and a third antireflection film 20 made of a titanium nitride film having a thickness of approx. 50 nm are formed on the entire surface through the sputtering method. Then, patterning is performed through a photolithographic process and reactive-ion etching to form a third wiring layer made up of the third refractory metal film 18, the third metal film 19, and the third antireflection film 20.

Then, as shown in FIG. 8B, a cover film 22 made up of a plasma oxide film having a thickness of approx. 0.8 $\mu$m and a plasma SiON film having a thickness of approx. 0.3 $\mu$m is formed.

The above conventional manufacturing method has a problem that the dielectric constant of HSQ rises in the manufacturing process though an HSQ film serving as a low dielectric constant film is used as a interlayer insulating film and thus, the wiring capacitance increases.

That is, when high-temperature heat is applied to an HSQ film after it is formed, some of Si-H bonds are broken down and they are changed to, for example, Si-OH bonds. Therefore, the number of Si-H bonds in the HSQ film decreases and thereby, the dielectric constant of the HSQ film increases. It is estimated that in the above conventional method the breakdown of Si-H bonds occurs when the plasma oxide film is formed at a temperature of approx. 300 to 400° C. or the tungsten film is formed at a temperature of approx. 400 to 450° C. Particularly, the number of Si-H bonds is greatly decreased at 400° C. or higher. Therefore, the number of Si-H bonds is greatly decreased under formation of a tungsten film when the highest temperature is used in the process, and the process causes the wiring capacitance to greatly increase.

SUMMARY OF THE INVENTION

It is an object of the present invention to provide a semiconductor device manufacturing method capable of manufacturing a semiconductor device having a small wiring capacitance even if a wiring pitch is small.

According to the present invention, a semiconductor device manufacturing method comprising the steps of forming a interlayer insulating film containing a hydrogen silsesquioxance (HSQ) film on the wiring layer, implanting hydrogen ions into the HSQ film, and annealing the semiconductor device is obtain.

Moreover, according to the present invention, a semiconductor device manufacturing method further comprising the steps of forming a via hole in the interlayer insulating film and embedding a tungsten film in the via hole, wherein the ion-implanting step and the annealing step are performed after the tungsten-embedding step is obtain.

Furthermore, according to the present invention, a semiconductor device manufacturing method in which the annealing step is performed in an atmosphere containing hydrogen is obtain.

According to the above methods, hydrogen is replenished into HSQ in which the number of Si-H bonds is decreased due to some of Si-H bonds being broken. Broken-down Si-H bonds are reconstructed, and the number of Si-H bonds again increases. Thereby, the dielectric constant of the HSQ lowers again, the wiring capacitance is reduced, and resultantly high operation speed and low power consumption are realized.

BRIEF DESCRIPTION OF THE DRAWINGS

The above and other objects, advantages, and features of the present invention will be more apparent from the following description taken in conjunction with the accompanying drawings, in which:

FIG. 4 is an illustration showing the comparison between dielectric constants of HSQ films of the first embodiment of the present invention and a conventional example;

DESCRIPTION OF THE PREFERRED EMBODIMENTS

[First embodiment]

Figure 1A:
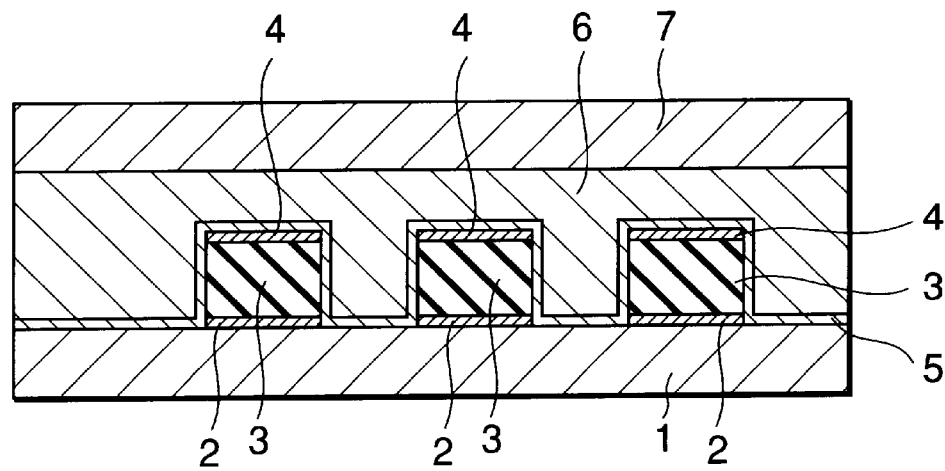
FIGS. 1A and 1B are sectional views showing the semiconductor device manufacturing method of the first embodiment of the present invention.

As shown in FIG. 1A, a first refractory metal film 2 made of a titanium film having a thickness of approx. 30 nm and a titanium nitride film having a thickness of approx. 100 nm, a first metal film 3 made of an AlCu film having a thickness of approx. 0.5 μm, and a first antireflection film 4 made of a titanium nitride film having a thickness of approx. 50 nm to prevent reflection in a photolithographic process are formed on a first interlayer insulating film 1 made of a BPSG film having a thickness of approx. 0.8 μm in order from the bottom through the sputtering method. In this case, the first refractory metal film 2 and first antireflection film 4 are formed at a temperature of approx. 150 to 300° C. and the first metal film 3 is formed at a temperature of approx. 100 to 400° C. Then, patterning is performed through a photolithographic process and reactive-ion etching to form a first wiring layer made up of the first refractory metal film 2, the first metal film 3, and the first antireflection film 4. Thereafter, a first plasma oxide film 5 having a thickness of approx. 50 nm is formed through the plasma CVD method using a mixed gas of $SiH_4$ and $NH_3$ at, for example, approx. 300 to 400° C. The plasma oxide film 5 is formed to improve the adhesiveness between an HSQ film to be formed next and the first wiring layer. HSQ is applied onto the first wiring layer so that a formed HSQ film has a thickness of approx. 0.4 μm. Then, baking is performed for 1 min at 150, 200, and 350° C. respectively and further in a nitrogen atmosphere at 400° C. for 60 min to form an HSQ film 6 as an interlayer insulating film. Moreover, a second plasma oxide film 7 having a thickness of approx. 1.4 μm is formed on the HSQ film 6 at 300 to 400° C. through the plasma CVD method. At least either of chemical polishing or mechanical polishing is performed so that the sum of thicknesses of the HSQ film 6 and second plasma oxide film 7 becomes approx. 0.8 μm on the first wiring layer. Since the HSQ film is a coating film, by itself, the thickness of the film is insufficient as an interlayer insulating film. Also, the quality of the HSQ film is deteriorated when it is exposed to an abrasive or cleaning solution. Therefore, in this embodiment, the second plasma oxide film 7 is formed on the HSQ film 6 to enable sufficient amount of CMP required to achieve a sufficiently planar surface.

Figure 1B:
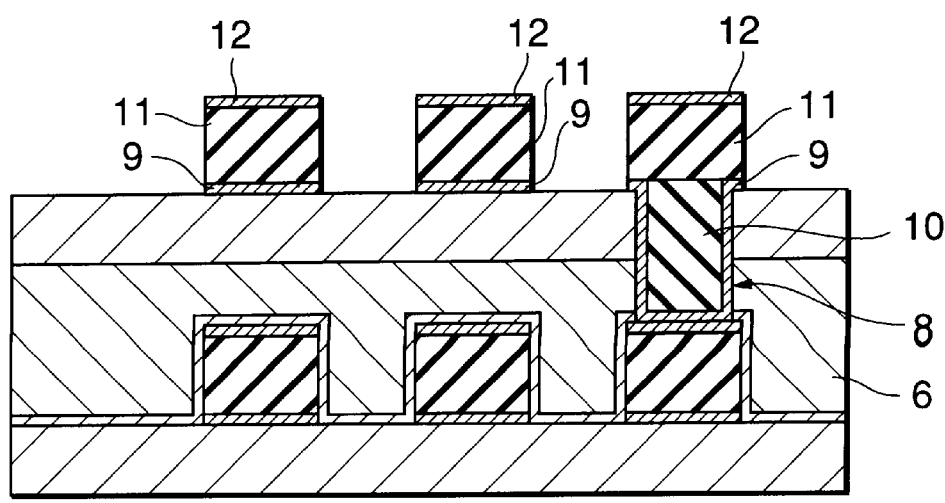

Then, as shown in FIG. 1B, a first via hole 8 is formed through a photolithographic process and reactive-ion etching. Then, a second refractory metal film 9 made up of a titanium film having a thickness of approx. 30 nm and a titanium nitride film having a thickness of approx. 100 nm is formed in the first via hole 8 at approx. 150 to 300° C. through a sputtering method. Further, tungsten is deposited to a thickness of approx. 0.5 μm at a temperature of 400 to 450° C. through the CVD method using $WF_6$ or the like as a source gas and then the tungsten is left only in the first via hole 8 through etching-back to form a first tungsten film 10. Then, a second metal film 11 made of an AlCu film having a thickness of approx. 0.5 μm and a second antireflection film 12 made of a titanium nitride film having a thickness of approx. 50 nm are formed on the entire surface through the sputtering method similarly to the case of the first metal film 3 and first antireflection film 4. Then, patterning is performed through a photolithographic process and reactive-ion etching to form a second wiring layer made up of the second refractory metal film 9, second metal film 11, and second antireflection film 12.

Figure 2A:
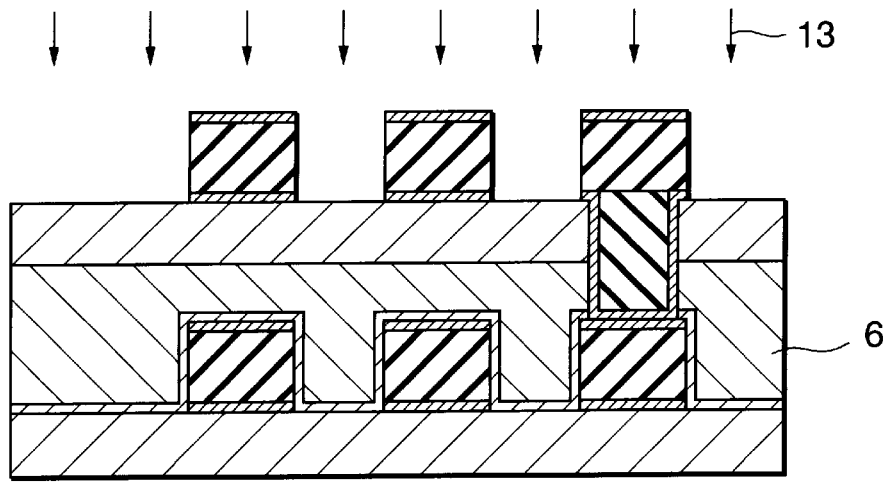
FIGS. 2A and 2B are sectional views showing the semiconductor device manufacturing method of the first embodiment of the present invention.

Then, as shown in FIG. 2A, hydrogen ions 13 are implanted at, for example, an energy of 50 keV and with a dose of approx. $1\times10^{-16}/cm^2$. Then, annealing is applied for approx. 10 min at a temperature of approx. 400° C. In this case, it is preferable to use a mixed gas of hydrogen and nitrogen at the ratio 1:1 as an annealing atmosphere. According to the above treatment, Si-H bonds broken down by preceding heat treatments, mainly at the time of forming tungsten film 10 are reconstructed to lower the dielectric constant that had increased.

Figure 2B:
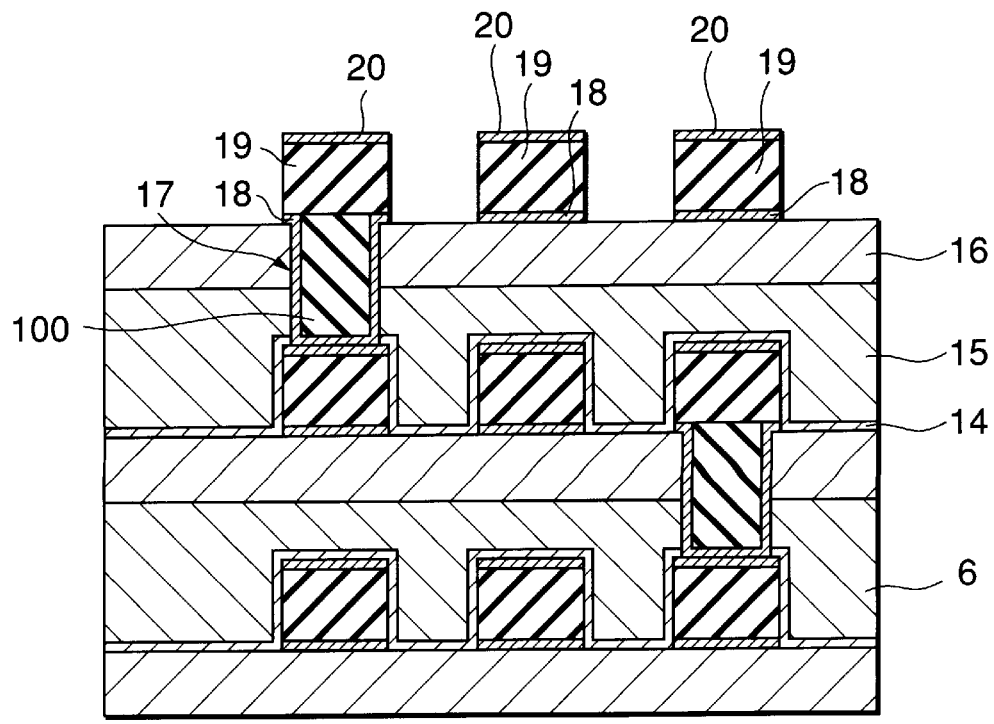

Then, as shown in FIG. 2B, a third plasma oxide film 14 having a thickness of approx. 50 nm is formed at a temperature of approx. 300 to 400° C. by the plasma CVD method using, for example, a mixed gas of $SiH_4$ and $NH_3$. Then, an HSQ film 15 is formed on the second wiring layer so as to have a thickness of approx. 0.4 µm by applying and baking HSQ, similar to the HSQ film 6. Then, a fourth plasma oxide film 16 having a thickness of approx. 1.4 µm is formed on the film 15 through the plasma CVD method. Then, at least either of chemical polishing or mechanical polishing is applied to the fourth plasma oxide film 16 on the second wiring layer so that the sum of thicknesses of the HSQ film 15 and the fourth plasma oxide film 16 becomes approx. 0.8 µm.

Thereafter, a second via hole 17 is formed through a photolithographic process and reactive-ion etching. A third refractory metal film 18 made of a titanium film having a thickness of approx. 30 nm and a titanium nitride film having a thickness of approx. 100 nm is formed in the second via hole 17 through the sputtering method. Moreover, tungsten is deposited up to approx. 0.5 µm at a temperature of 400 to 450° C. through the CVD method by using $WF_6$ or the like as a source gas, and then the tungsten is left only in the via hole 17 through an etch-back process to form a tungsten film 100. Then, a third metal film 19 made of an AlCu film having a thickness of approx. 0.5 µm and a third antireflection film 20 made of a titanium nitride film having a thickness of approx. 50 nm are formed on the entire surface through the sputtering method. Then, patterning is performed through a photolithographic process and reactive-ion etching to form a third wiring layer made up of the third refractory metal film 18, third metal film 19, and third antireflection film 20.

Figure 3A:
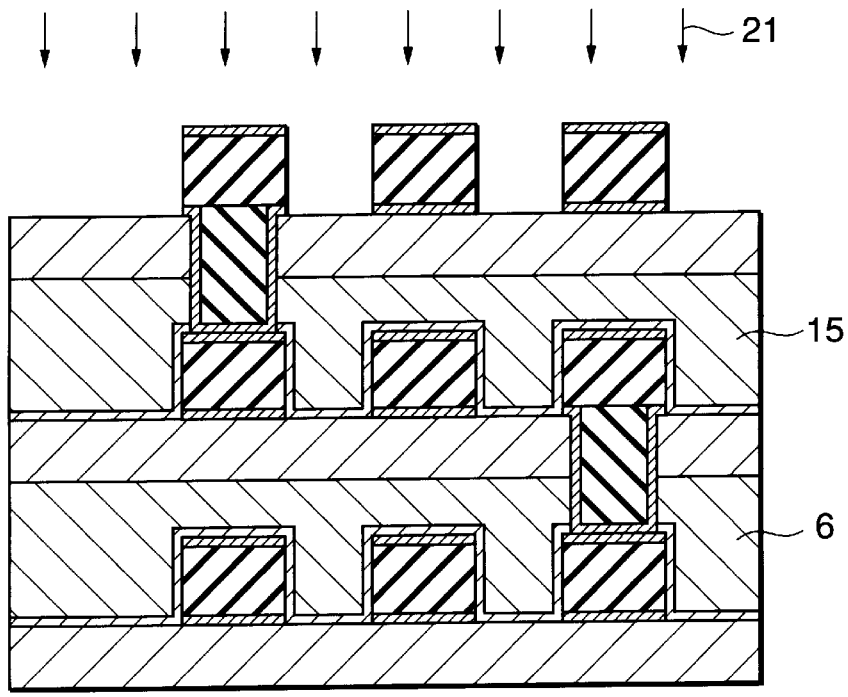
FIGS. 3A and 3B are sectional views showing the semiconductor device manufacturing method of the first embodiment of the present invention.

Then, as shown in FIG. 3A, hydrogen ions 21 are implanted at, for example, an energy of 50 keV and with a dose of approx. $1\times10^{16}/cm^2$. Then, annealing is performed at a temperature of approx. 400° C. for approx. 10 min. In this case, it is preferable to use a mixed gas of hydrogen and nitrogen at the ratio 1:1 as an annealing atmosphere. According to this ion implantation and annealing, Si-H bonds in the HSQ films 15 and 6 broken down mainly when the second tungsten film 100 is formed are reconstructed and it is possible to lower the dielectric constants of the HSQ films 15 and 6.

Figure 3B:
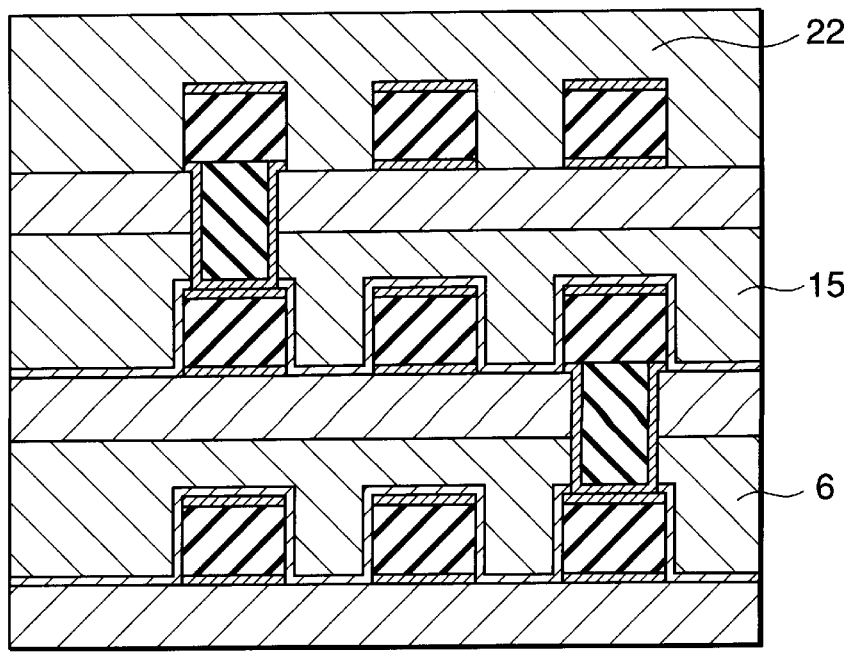

Then, as shown in FIG. 3B, a cover film 22 made up of a plasma oxide film having a thickness of approx. 0.8 µm and a plasma SiON film having a thickness of approx. 0.3 µm is formed. Differently from the first and second wiring layers, an HSQ film is not formed on the third wiring layer. This is because the wiring on the uppermost layer is normally used only as power-supply wiring or ground wiring having a large pitch and therefore, a slight wiring capacitance does not become a problem. Therefore, when a wiring capacitance is a problem, it is preferable to also use an HSQ film for this layer.

In the case of the first embodiment of the present invention described above, the HSQ film 6 is formed and then, a second wiring layer is formed on the film 6 and thereafter, hydrogen ions 13 are implanted and after that, annealing is performed. Therefore, in the HSQ film 6, Si-H bonds broken down due to high-temperature heat treatment, particularly due to formation of the tungsten film 10 for embedding the first via hole 8, are reconstructed and the raised dielectric constant is lowered again. Similarly, the HSQ film 15 is formed, then the third wiring layer is formed on the film 15, and thereafter hydrogen ions 21 are implanted and after that annealing is performed. Thereby, in the HSQ film 15, Si-H bonds broken down due to formation of the tungsten film 100 for embedding the second via hole 17 are reconstructed and the raised dielectric constant is lowered again. In this case, in the HSQ film 6, Si-H bonds broken down due to formation of the tungsten film 100 are simultaneously reconstructed and the dielectric constant is reduced.

Figure 7A:
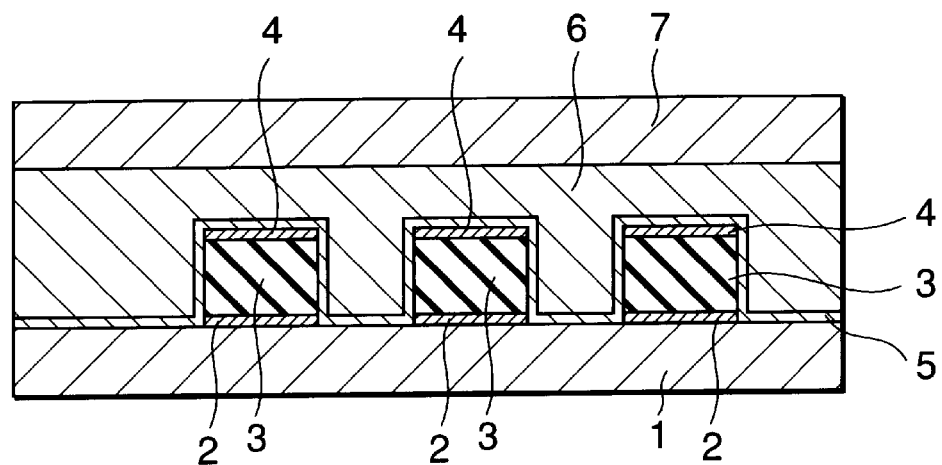
FIGS. 7A and 7B are sectional views showing the semiconductor device manufacturing method of a conventional example.
Figure 7B:
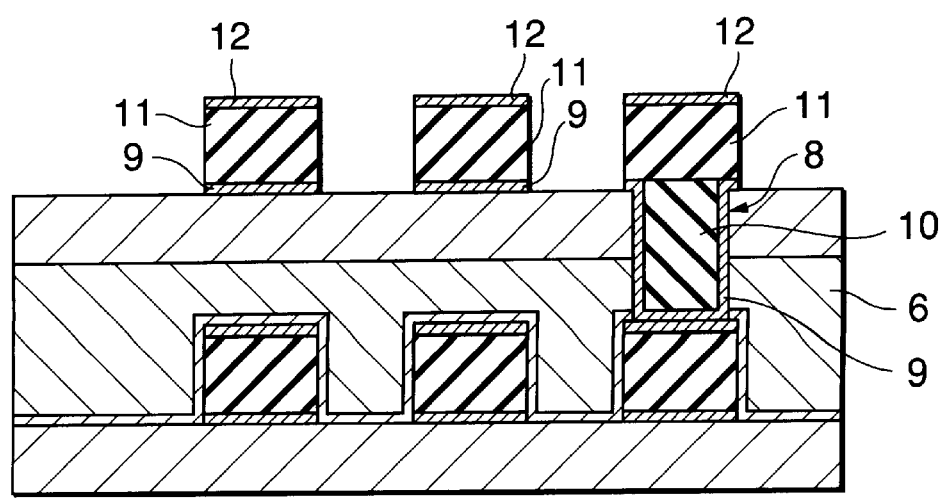
Figure 8A:
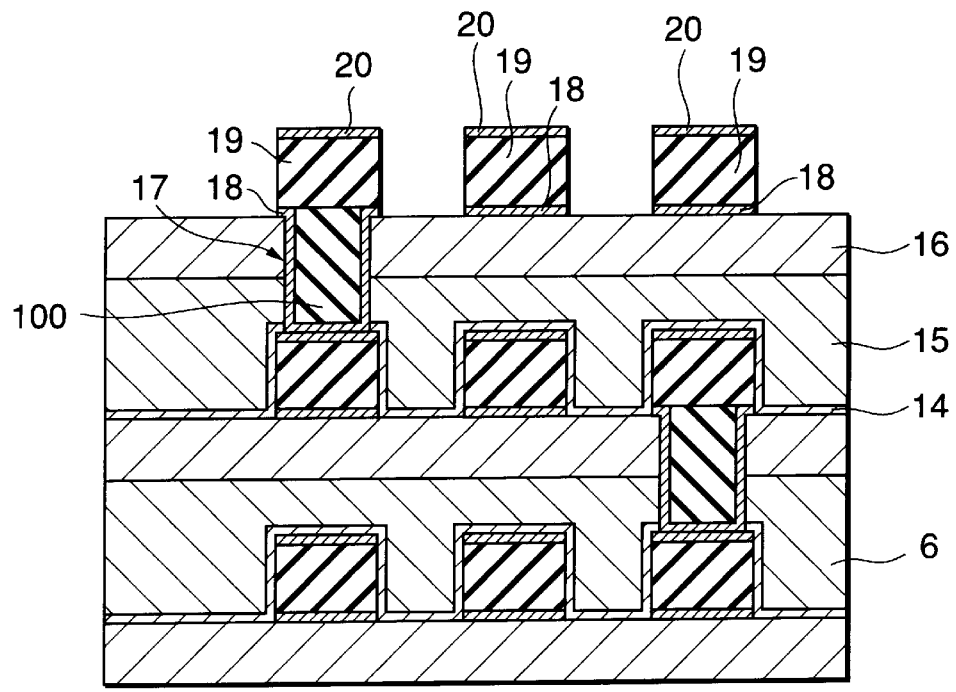
FIGS. 8A and 8B are sectional views showing the semiconductor device manufacturing method of a conventional example.
Figure 8B:
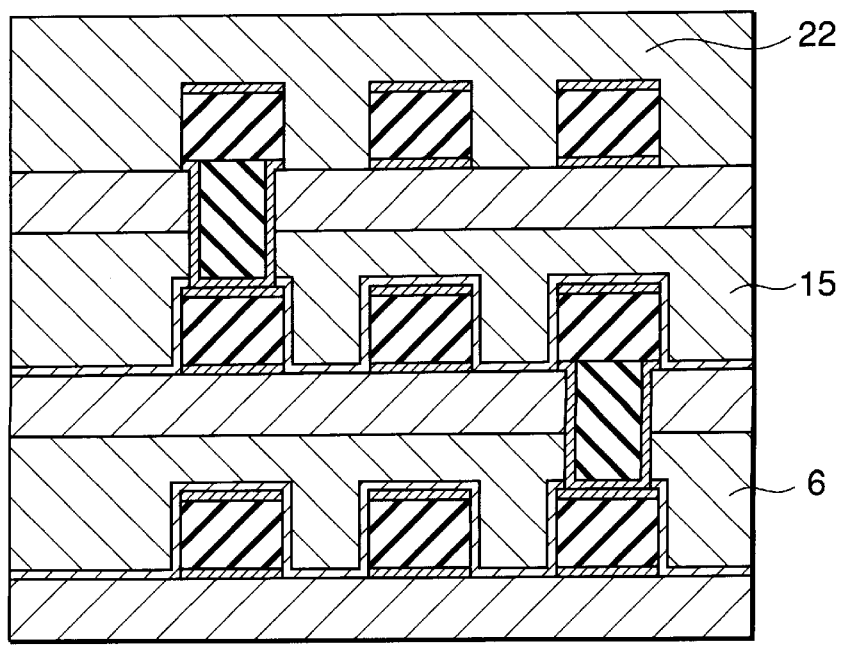

The above effect is described below by referring to FIG. 4. FIG. 4 is an illustration showing the comparison between dielectric constants of HSQ films of the first embodiment and the conventional example shown in FIGS. 7 and 8. In FIG. 4, in the case of the conventional example, it is found that the dielectric constant of the HSQ film 6 between the first and second wiring layers is extremely increased due to the heating process experienced by the HSQ films. When the cover film 22 is finally formed, the dielectric constant rises up to approx. 3.7. Moreover, the dielectric constant of the HSQ film 15 between the second and third wiring layers rises up to approx. 3.4. In the case of the first embodiment of the present invention, however, the dielectric constants of the HSQ films 6 and 15 are kept at approx. 3.1.

In the case of this embodiment, hydrogen ions are implanted after forming a wiring layer. This is because the tungsten films 10 and 100 are formed through a method of forming a tungsten film on a refractory metal film and thereafter leaving the tungsten film in a via hole through etching-back. That is, in the case of the above method, immediately after forming the tungsten films 10 and 100, the entire surfaces of the plasma oxide films 7 and 16 are covered with the refractory metal films 9 and 18. Thus, hydrogen ions hardly reach the HSQ films 6 and 15 even if hydrogen ions are implanted under the above state. Therefore, ions are implanted after wirings are patterned.

However, hydrogen ion implantation and annealing can be performed in the heating process or any time after tungsten films are formed. For example, by embedding the tungsten films 10 and 100 in a via hole not through etching-back but through CMP, it is possible to perform the embedding of the films 10 and 100 immediately after the films 10 and 100 are formed if the upper sides of the oxide films 7 and 16 are exposed.

[Second Embodiment]

In FIGS. 5A and 5B and FIGS. 6A and 6B, portions same as those of the first embodiment are provided with the same symbol as those in FIGS. 1 to 4.

Figure 5A:
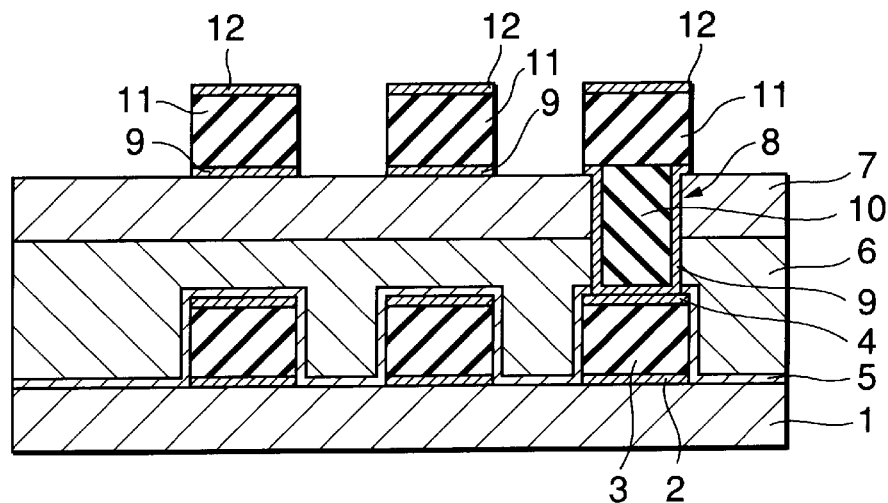
FIGS. 5A and 5B are sectional views showing the semiconductor device manufacturing method of the second embodiment of the present invention.

First, FIG. 5A shows a state in which up to a second wiring layer is formed in the same manufacturing process as the first embodiment shown in FIGS. 1A and 1B and the description of the manufacturing process up to here is omitted.

Figure 5B:
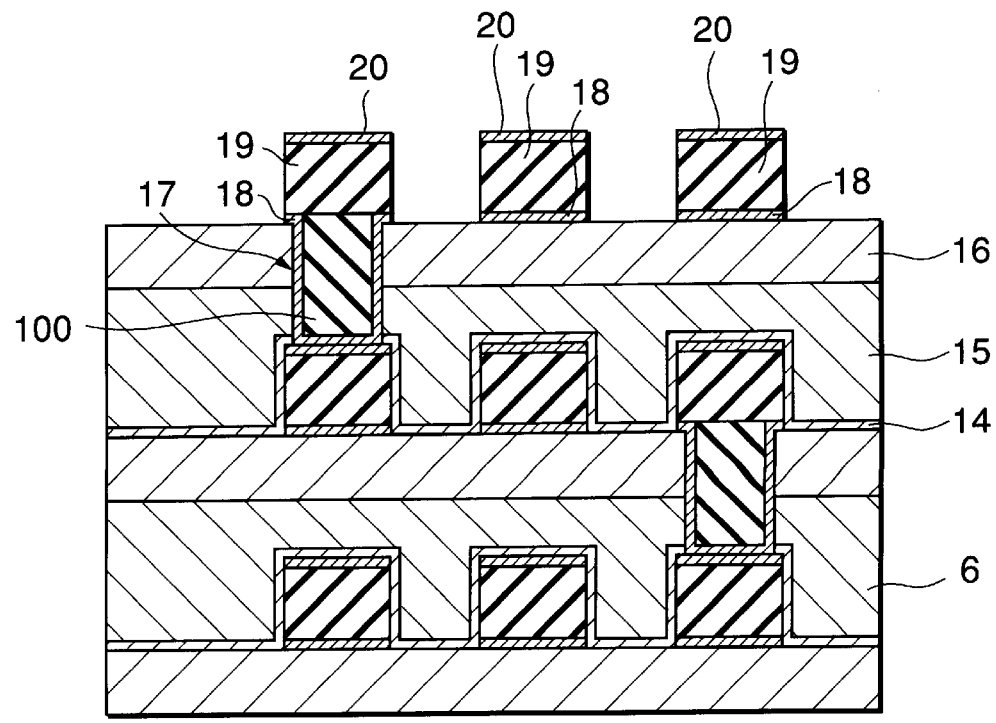

Then, as shown in FIG. 5B, a third plasma oxide film 14 having a thickness of approx. 50 nm is formed through the plasma CVD method using, for example, a mixed gas of $SiH_4$ and $NH_3$. Then, an HSQ film 15 is formed on the second wiring layer so that it has a thickness of approx. 0.4 µm by applying HSQ onto the wiring layer and baking it. Moreover, a fourth plasma oxide film 16 having a thickness of approx. 1.4 µm is formed on the film 15 through the plasma CVD method. Then, at least either of chemical polishing or mechanical polishing is applied to the fourth plasma oxide film 16 so that the sum of thicknesses of the HSQ film 15 and fourth plasma oxide film 16 becomes approx. 0.8 μm on the second wiring layer.

Moreover, a second via hole 17 is formed through a photolithographic process and reactive-ion etching. A third refractory metal film 18 made up of a titanium film having a thickness of approx. 30 nm and a titanium nitride film having a thickness of approx. 100 nm is formed in the second via hole 17 and on the fourth plasma oxide film 16 through the sputtering method. Then, tungsten is deposited up to a thickness of approx. 0.5 μm through the CVD method using $WF_6$ or the like as a source gas and then, the tungsten is left only in the via hole 17 through an etch-back process to form a second tungsten film 100. Then, a third metal film 19 made of an AlCu having a thickness of approx. 0.5 μm and a third titanium nitride film 20 having a thickness of approx. 50 nm are formed on the entire surface through the sputtering method. Moreover, patterning is performed through a photolithographic process and reactive-ion etching to form a third wiring layer made of the third refractory metal film 18, third metal film 19, and third titanium nitride film 20.

Figure 6A:
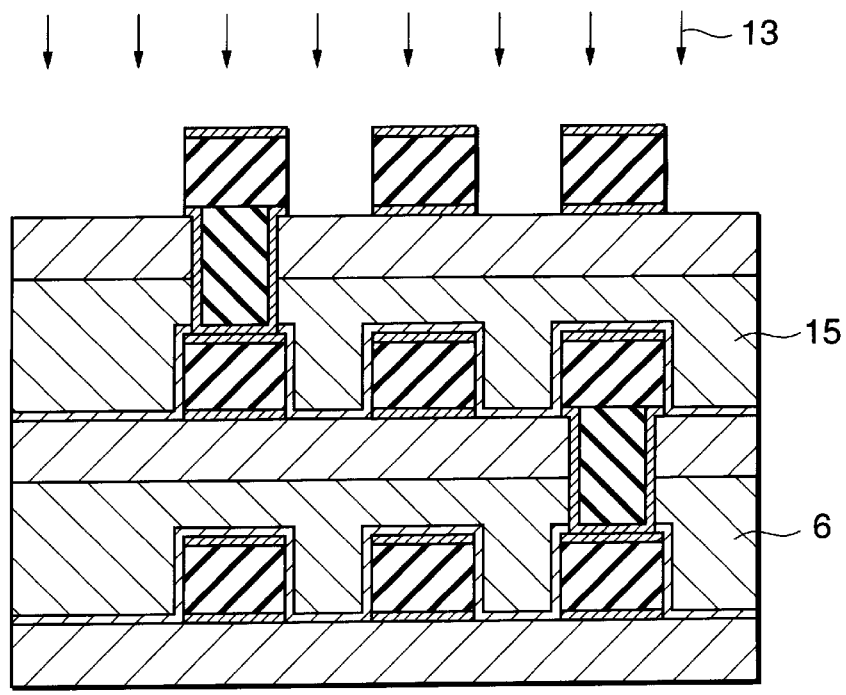
FIGS. 6A and 6B are sectional views showing the semiconductor device manufacturing method of the second embodiment of the present invention.

Then, as shown in FIG. 6A, hydrogen ions 13 are implanted at an energy of approx. 100 keV and with a dose of approx. $1 \times 10^{16}/cm^2$. In this case, most hydrogen ions 13 are particularly implanted into the HSQ film 6 between the first and second wiring layers. Then, annealing is performed at a temperature of approx. 400° C. for approx. 10 min. In this case, it is preferable to use a mixed gas of hydrogen and nitrogen at the ratio 1:1 as an annealing atmosphere.

Figure 6B:
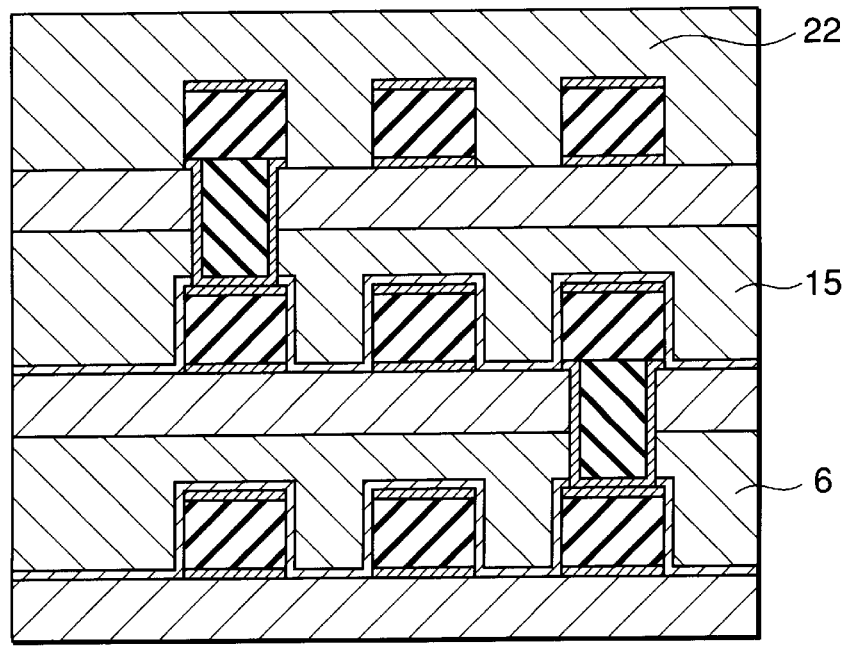

Finally, as shown in FIG. 6B, a cover film 22 made up of a plasma oxide film having a thickness of approx. 0.8 μm and a plasma SiON film having a thickness of approx. 0.3 μm is formed.

In the case of the second embodiment, implantation of hydrogen ions is performed only once after up to the uppermost wiring layer (second wiring layer in the case of this embodiment) is formed. Therefore, the second embodiment has a less number of steps than the first embodiment. Because the HSQ film 6 passes through the step of forming the first and second tungsten films 10 and 100, it has the maximum rise of the dielectric constant. However, because the hydrogen-ion implantation energy level is made higher than that of the first embodiment, hydrogen ions are adequately implanted into the HSQ film 6. Therefore, it is possible to increase the decreased number of Si-H bonds again.

Thus, by properly adjusting the implantation energy and dose of hydrogen ions, it is possible to reconstruct Si-H bonds by a one-time ion implantation process even in case of semiconductor devices in which interlayer insulating films including a plurality of HSQ films are laminated.

Moreover, in the case of the second embodiment, it is not restricted to perform hydrogen ion implantation and annealing after patterning of wiring layers similarly to the case of the first embodiment.

Further, in the present invention, for supplementing shortage of hydrogen in a HSQ film, it is preferable to use a gas including hydrogen as an annealing atmosphere after hydrogen-ion implanting. However, if a gas including too much hydrogen is used, Si-O bonds in the HSQ film are broken and Si-H bonds increase excessively. Consequently, the HSQ film is lowered in mechanical strength and it becomes to be easily peeled off thus lowering the reliability of wirings. Therefore, in the first and second embodiment, a mixed gas of hydrogen and nitrogen at the ratio 1:1 as an annealing atmosphere is used.

Further, in the present invention, protons or deuterium may be used instead of the hydrogen ions. In particular, since deuterium is heavy compared with hydrogen, it has easier control over a depth of implanting.

A semiconductor device manufacturing method of the present invention comprises the step of forming a interlayer-insulting film containing HSQ and thereafter implanting hydrogen ions into the semiconductor device and the step of annealing the semiconductor device. Therefore, it is possible to manufacture a semiconductor device having a small wiring capacitance even for a small wiring pitch.

That is, hydrogen is replenished to a interlayer insulating film in which some of Si-H bonds are broken down due to the heating process such as tungsten film formation and thereby the number of Si-H bonds is decreased, and thus broken-down Si-H bonds are reconstructed and the number of Si-H bonds is increased again. Thereby, the dielectric constant of HSQ is lowered again, the wiring capacitance is reduced, and resultant high speed operation and low power consumption are realized.

It is apparent that the present invention is not limited to the above embodiments, but may be modified and changed without departing from the scope and spirit of the invention.

What is claimed is:

1. A semiconductor device manufacturing method comprising:

forming an interlayer insulating film containing a hydrogen silsesquioxance (HSO) film on a wiring layer;

implanting hydrogen ions into said HSO film;

annealing said semiconductor device;

forming a via hole in said interlayer insulating film; and embedding a tungsten film in said via hole, wherein said ion implanting and the annealing are executed after said embedding of said tungsten-film.

2. The semiconductor device manufacturing method claimed in claim 1, wherein said forming of a interlayer insulating film includes forming a first insulating film on the surface of said wiring layer, forming said HSQ film on said first insulating film, forming a second insulating film on said HSQ film, and applying at least one of chemical polishing and mechanical polishing to said second insulating film.

3. A semiconductor device manufacturing method comprising:

forming an interlayer insulating film containing a hydrogen silsesquioxance (HSO) film on a wiring layer;

implanting hydrogen ions into said HSQ film;

annealing said semiconductor device;

forming a via hole in said interlayer insulating film;

forming a refractory metal film in said via hole and on said interlayer insulating film;

embedding a tungsten film in said via hole;

forming a metal film on said refractory metal film; and patterning said metal film and said refractory metal film into a wiring shape, wherein said hydrogen-ion implanting and said annealing are executed after said patterning.

4. A semiconductor device manufacturing method comprising;

forming an interlayer insulating film containing a hydrogen silsesquioxance (HSO) film on a wiring layer;

implanting hydrogen ions into said HSO film; and thereafter annealing said semiconductor device, wherein said annealing is executed in an atmosphere containing hydrogen.

5. A semiconductor device manufacturing method for manufacturing a semiconductor device comprising a plurality of wiring layers and a plurality of layer-insulting films for insulating each of said wiring layers and having a hydrogen silsesquioxance (HSQ) film included in each of said interlayer insulating films, the method comprising;

implanting hydrogen ions into said HSQ films; and annealing said semiconductor device, wherein said ion implanting and said annealing are executed only once after the uppermost one of said interlayer insulating films is formed.

6. The semiconductor device manufacturing method claimed in claim 5, wherein an ion-implanting energy is adjusted so that hydrogen ions reach up to the lowermost one of said interlayer insulating films.

* * * * *